United States Patent [19]
Ito et al.

[11] Patent Number: 5,936,712
[45] Date of Patent: Aug. 10, 1999

[54] EXPOSURE METHOD AND APPARATUS INCLUDING FOCUS CONTROL

[75] Inventors: Masanobu Ito, Kawasaki; Masamitsu Yanagihara, Zama; Hideji Goto, Chiba; Yoshiyuki Katamata, Tokyo, all of Japan

[73] Assignee: Nikon Corporation, Tokyo, Japan

[21] Appl. No.: 09/018,558

[22] Filed: Feb. 4, 1998

[30] Foreign Application Priority Data

Feb. 10, 1997 [JP] Japan .................................. 9-041500

[51] Int. Cl.$^6$ ........................ G03B 27/42; G03B 27/52; G03B 27/32; G01B 11/00
[52] U.S. Cl. .............................. 355/55; 355/53; 355/77; 356/401
[58] Field of Search ...................... 355/53, 55, 67, 355/77; 356/399, 400, 401

[56] References Cited

U.S. PATENT DOCUMENTS 5,657,130  8/1997  Shirasu et al. .

FOREIGN PATENT DOCUMENTS

A-7-57986   3/1995  Japan .
A-7-273000  10/1995 Japan .

*Primary Examiner*—Safet Metjahic
*Assistant Examiner*—Peter Kim
*Attorney, Agent, or Firm*—Oliff & Berridge, PLC

[57] ABSTRACT

To improve the focus accuracy during alignment and to improve the alignment accuracy even if a substrate has warpage, during alignment, an approximate focus plane is obtained by using only the detection results at focus points of focus sensors located near the ends of a substrate, close to alignment points, and without using the detection results at focus points of two central focus sensors. The auto-focus operation is performed by using the above operation results. As a result, a substrate is driven so as to be adjusted to the approximate focus plane during alignment.

24 Claims, 8 Drawing Sheets

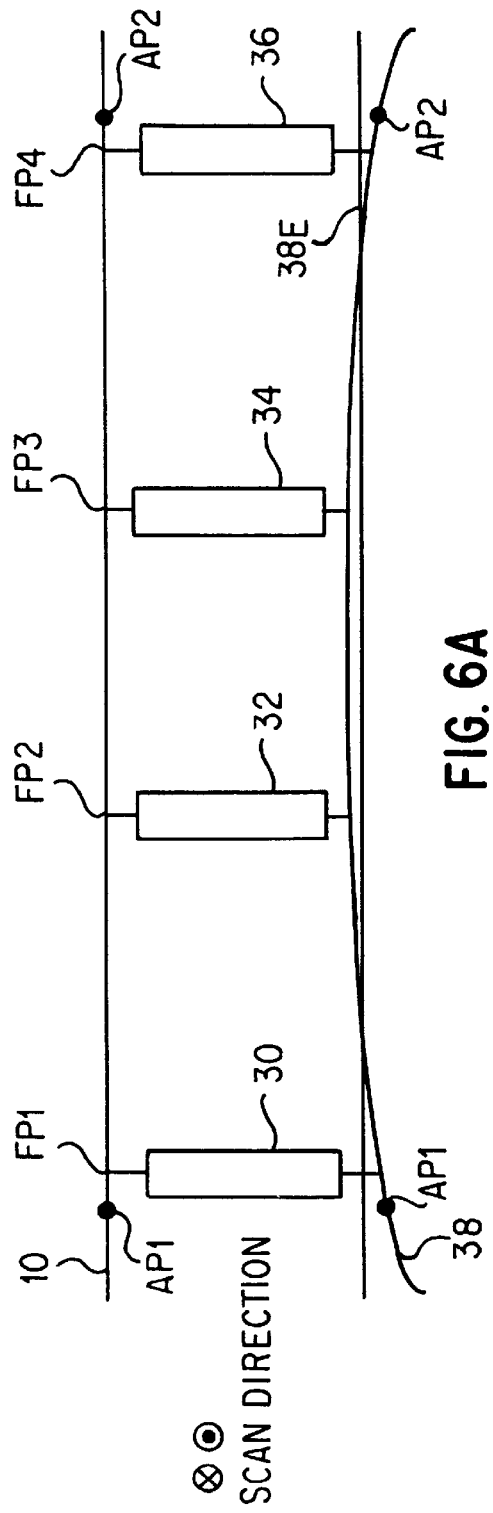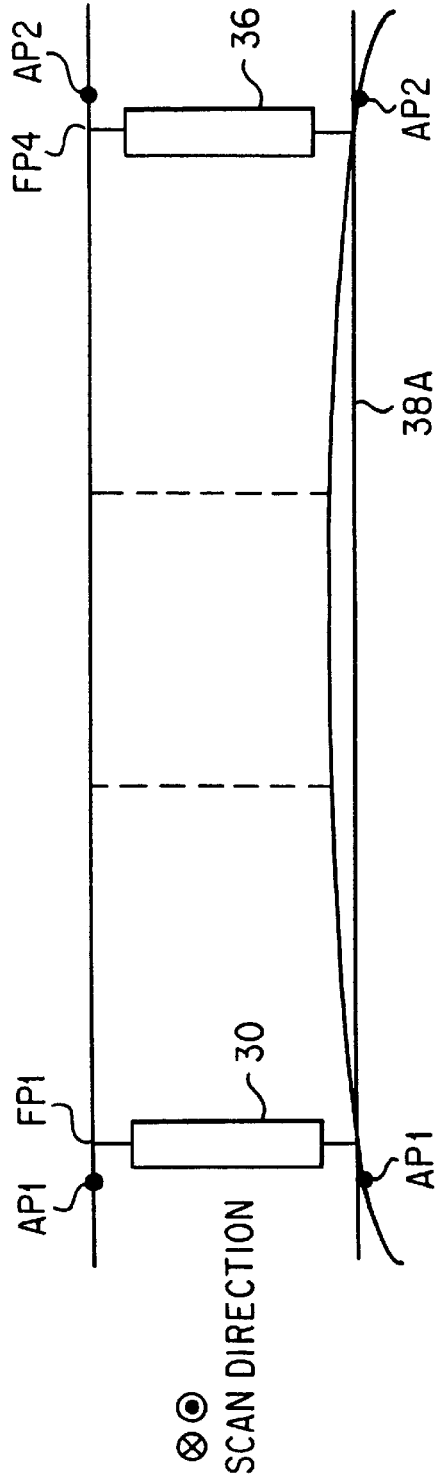

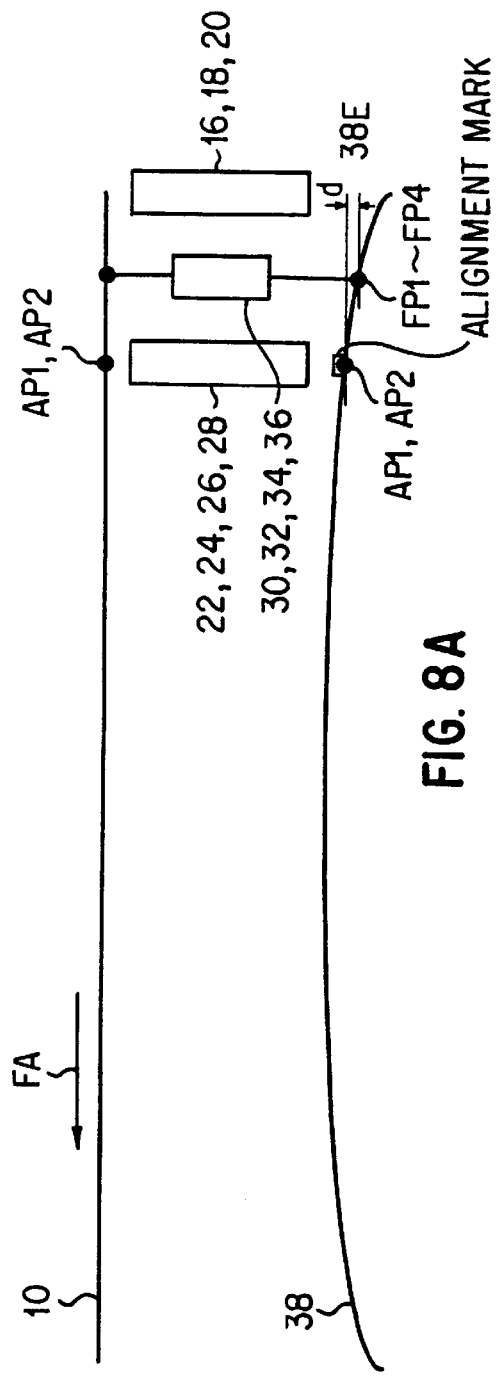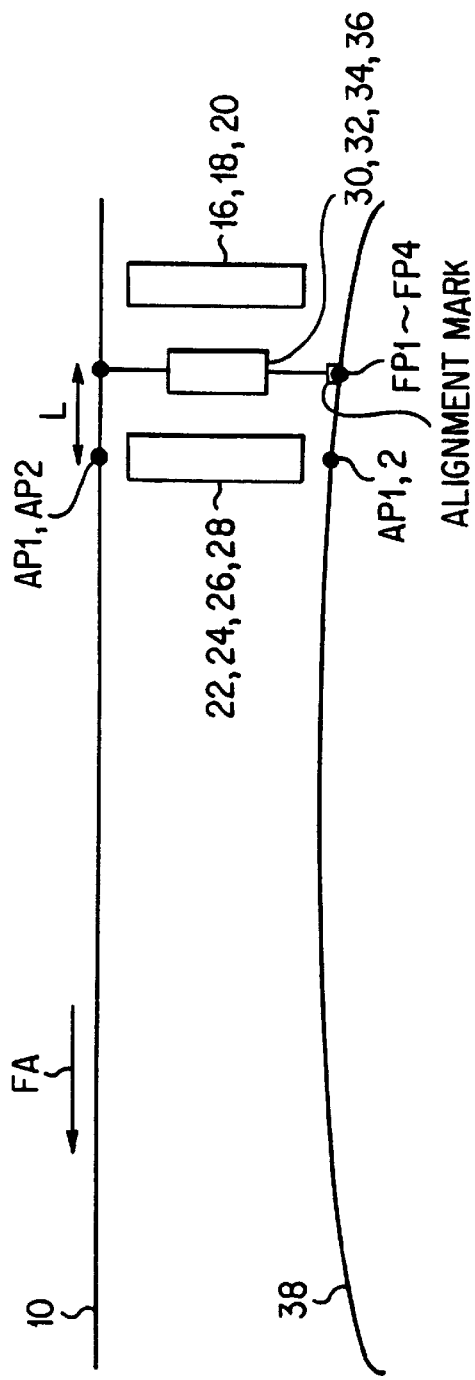

EXPOSURE METHOD AND APPARATUS INCLUDING FOCUS CONTROL

INCORPORATION BY REFERENCE

The disclosure of the following priority application is herein incorporated by reference: Japanese Patent Application No. 9-041500, filed Feb. 10, 1997.

The disclosure of U.S. Pat. No. 5,657,130 is incorporated herein by reference.

BACKGROUND OF THE INVENTION

1. Field of Invention

The present invention relates to a scanning-type exposure system for synchronously scanning a mask (such as a photo mask or reticle) and a substrate (such as a wafer or glass plate) relative to a projection optical system, and more particularly to improvement of a focus control method of a projection optical system under scanning exposure and alignment.

2. Description of Related Art

A scanning-type exposure system for synchronously scanning a mask and a substrate relative to a projection optical system is disclosed in, for example, Japanese Laid-Open Patent Application No. 7-57986. A focus control method of the scanning-type exposure system of this type is disclosed in Japanese Laid-Open Patent Application No. 7-273000. Also see U.S. Pat. No. 5,657,130, which claims priority from Japanese Laid-Open Patent Application No. 7-273000.

According to the scanning exposure method disclosed in these references, a pattern on a mask is projected onto a substrate as an erect positive image at one-to-one magnification by a projection optical system. Only a portion of the mask is illuminated at any particular moment, for example, with a slit-shaped illumination area. However, by synchronously scanning the mask and the substrate relative to an illuminating optical system and a projection optical system, the entire pattern on the mask is sequentially projected onto the substrate.

This type of scanning-type exposure system is provided with a focus detection system in order to expose a pattern image on a mask to a substrate at a high resolution. The focus detection system detects the positional information of the mask and the positional information of the substrate at each of a plurality of measurement points that extend in the direction perpendicular to a scanning direction of the mask and the substrate. The average of the measured values is calculated in accordance with the detection results and one or both of the interval (space or distance) between the mask and the substrate and the relative inclination between the mask and the substrate is adjusted. Thus, it is possible to adjust the average planes of the mask and the substrate to the appropriate positional relation conjugate about the projection optical system.

In the case of the above Japanese Laid-Open Patent Applications, focus control is performed during exposure (of the wafer or glass plate) using the technique described above. Therefore, if a substrate is warped, the following problem occurs.

As described above, when focusing during exposure, the average value of detection results of all measurement points of a focus detection system is calculated and the average plane of a mask and of a substrate are adjusted to a predetermined positional relation for a projection optical system in accordance with the average value.

However, the detection point of an alignment sensor that is used for detecting an alignment mark on the substrate is set only at end positions of the substrate, which is different from the measurement points used in the above-described focus detection system. Therefore, when detecting the alignment mark on the substrate by using the alignment sensor, if the plane of the substrate is set by performing the focus control in a manner similar to that used during exposure, the position of the substrate at the detection point of the alignment sensor may be deviated from an optimum focus position.

SUMMARY OF THE INVENTION

The present invention addresses the above problem and has as one object to improve the alignment accuracy of a substrate. More particularly, it is one object of the present invention to provide a focus control apparatus and method capable of reducing or preventing alignment-mark detection errors due to warpage or waviness of a substrate.

To achieve the above and/or other objects, one aspect of the present invention detects the positional information of a substrate in the optical axis direction of a projection optical system at each of a plurality of measurement points using a focus sensor. The measurement points are in a predetermined plane that is almost the same as the imaging plane of the projection optical system. The relative interval (space or distance) or inclination between the mask and the substrate is adjusted by using the detection result of each of the measurement points during scanning exposure. During alignment, however, the relative interval or inclination between the mask and the substrate is adjusted by using only the detection result(s) at one or more measurement point(s) near the detection point of an alignment sensor. Thus, during alignment, less than all of the measurement points of the focus sensor are used.

According to another aspect of the present invention, during alignment, the relative interval or inclination between the mask and the substrate is adjusted by estimating a deviation for a predetermined plane on the surface of the substrate at the detection point of the alignment sensor in accordance with the measurement results at the measurement points of the focus sensor.

According to still another aspect of the present invention, during alignment, the relative interval or inclination between the mask and the substrate is adjusted by using the measurement results at the measurement points of the focus sensor when the alignment mark on the substrate is located by a predetermined distance to one side of the detection point of the alignment sensor in a scanning direction.

Thus, by performing focus control under an alignment operation in accordance with a method different from that used at the time of (scanning) exposure while considering the positional relation between the measurement points of a focus sensor and the detection point of an alignment sensor, it is possible to improve the focus accuracy during alignment and realize higher-accuracy alignment.

Other aspects of the invention include apparatus for performing the methods outlined above.

The above and other objects, features, and advantages of the present invention will become more apparent from the following detailed description and the accompanying drawings.

BRIEF DESCRIPTION OF THE DRAWINGS

The invention will be described in conjunction with the following drawings in which like reference numerals designate like elements and wherein:

FIGS. 6A and 6B are illustrations showing an auto-focus operation when there is warpage or waviness in the direction perpendicular to a scanning direction;

FIGS. 8A and 8B are illustrations showing an auto-focus operation when there is warpage or waviness in a scanning direction.

DETAILED DESCRIPTION OF PREFERRED EMBODIMENTS

Figure 1:
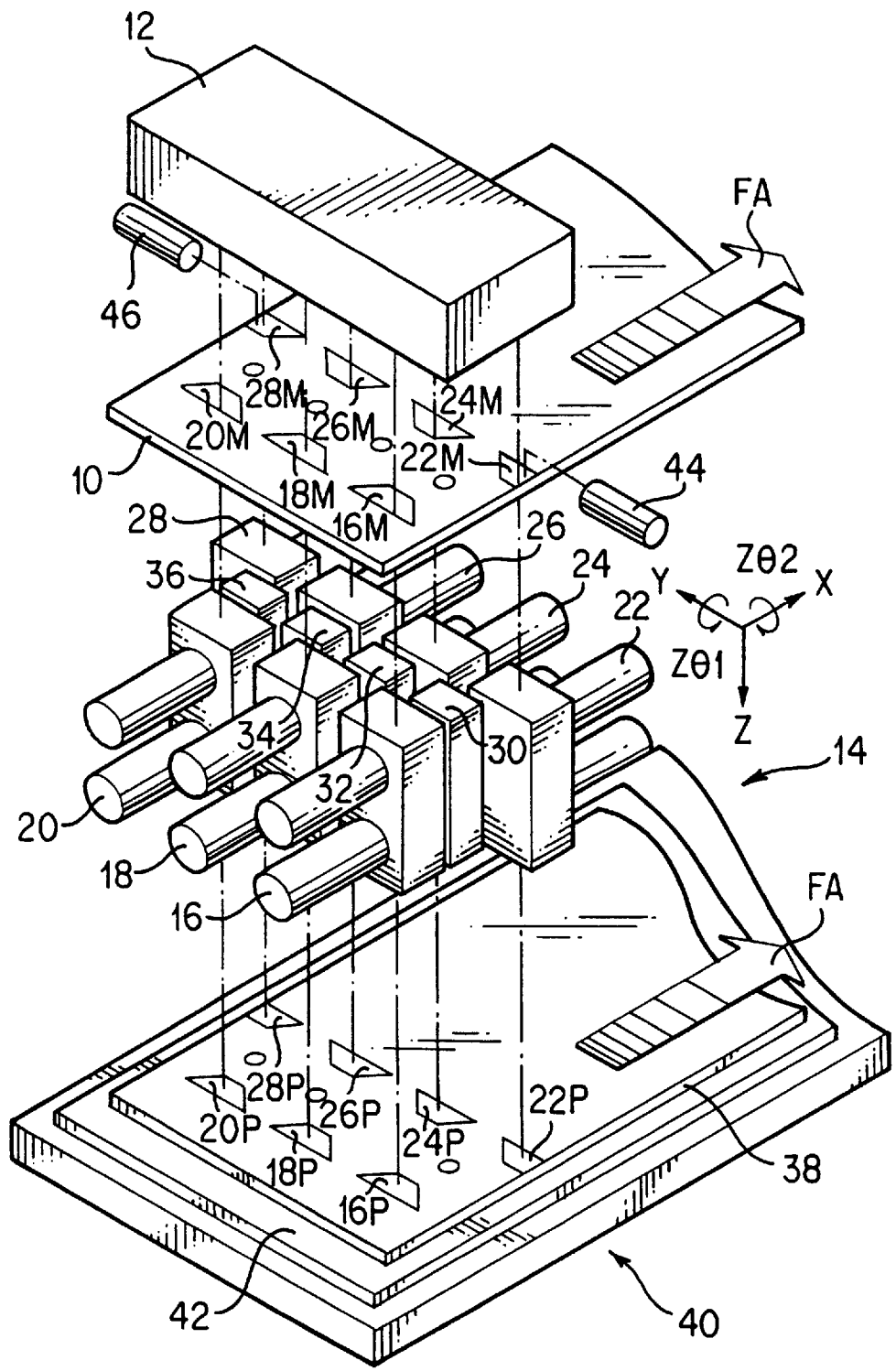
FIG. 1 is a perspective view showing a portion of an exposure system to which a focus control method of the present invention is applied.

Preferred embodiments of the present invention are described below by referring to the accompanying drawings. FIG. 1 shows part of a scanning-type exposure system. In FIG. 1, it is assumed that the scanning direction of a mask and plate shown by an arrow FA is the X axis, the direction perpendicular to the scanning direction in the plane of the mask is the Y axis, and the normal direction of the mask plane perpendicular to the X and Y axes is the Z axis.

The projection optical system, including multiple trapezoidal illumination regions, and the focusing sensors, which will be described below, are generally similar to the systems described in the above-incorporated U.S. Pat. No. 5,657,130. Reference should be made to that patent for a more detailed description of these general systems. The exposure apparatus can be used to manufacture, for example, a large liquid crystal panel (liquid crystal display element), a semiconductive element particularly when the element has a large area), and the like. Typically, a plate (such as, for example, a glass plate) is exposed to manufacture a liquid crystal display element, whereas a wafer is exposed to manufacture semiconductor elements. The exposed plate or wafer, etc., is generally referred to as a substrate herein.

In FIG. 1, a mask 10 having a pattern to be exposed is located in the XY plane. An illuminating optical system 12 provided with an optical integrator for making uniform the illuminance distribution of a light source such as, e.g., a mercury lamp or exposure light is set above the mask 10. A projection optical system 14 is set below the mask 10. The projection optical system 14 includes front-group projection lens units 16, 18 and 20, rear-group projection lens units 22, 24, 26 and 28, and focus sensors 30, 32, 34 and 36. The focus sensors 30 to 36 are set between the front-group projection lens units 16 to 20 and the rear-group projection lens units 22 to 28. A plate 38 obtained by applying resist to a glass substrate is located below the lens units 16 to 28 and the focus sensors 30 to 36.

The mask 10 is held by a not-illustrated mask stage and the plate 38 is held by a plate stage 40. The plate stage 40 has a Z leveling stage 42 so that the position of the plate 38 mounted on the Z leveling stage 42 in the Z direction and the inclination of the plate 38 can be optimally adjusted. Because the mask stage and the plate stage are synchronously scanned relative to the projection optical system 14 in the direction of the arrow FA at the same time, they are mounted on a not-illustrated carriage.

Alignment sensors 44 and 46 are arranged above the mask 10 to detect an alignment mark on the mask 10 and an alignment mark formed on the plate 38. As shown in FIG. 1, the illuminating light emitted from the alignment sensors 44 and 46 is applied onto the mask 10 and is applied onto the plate 38 through the rear-group lens units 22 and 28 of the projection optical system 14. The light passing through the lens units 22 and 28 of the projection optical system 14 and reflected from the plate 38 and the light reflected from the mask 10 enter the alignment sensors 44 and 46. The alignment sensors 44 and 46 respectively detect the position of each alignment mark in accordance with the light reflected from the mask 10 and the light reflected from the plate 38. This enables the mask 10 and plate 38 to be aligned with each other.

Trapezoidal illumination regions 16M, 18M, 20M, 22M, 24M, 26M and 28M are formed on the mask 10 by the exposure light emitted from the illuminating optical system 12 and projection regions 16P, 18P, 20P, 22P, 24P, 26P and 28P are formed on plate 38 at positions conjugate with the illumination regions 16M to 28M about the projection optical system 14 respectively. The projection lens unit 16 included in the projection optical system 14 is constituted by combining, for example, two sets of a Dyson-type optical system. Accordingly, a pattern on the mask 10 in, for example, the projection region 16M is projected on the plate 38 into the projection region 16P as an erect positive image at one-to-one magnification. The same is true for other projection lens units 18 to 28. Therefore, patterns on the mask 10 in the illumination regions 18M to 28M on the mask 10 are projected into the projection regions 18P to 28P on the plate 38 as erect positive images at one-to-one magnification by the projection lens units 16 to 28. Specific examples of the illuminating optical system 12 and the projection lens units 16 to 28 are disclosed in the above-described Japanese and U.S. Patent references.

Figure 2:
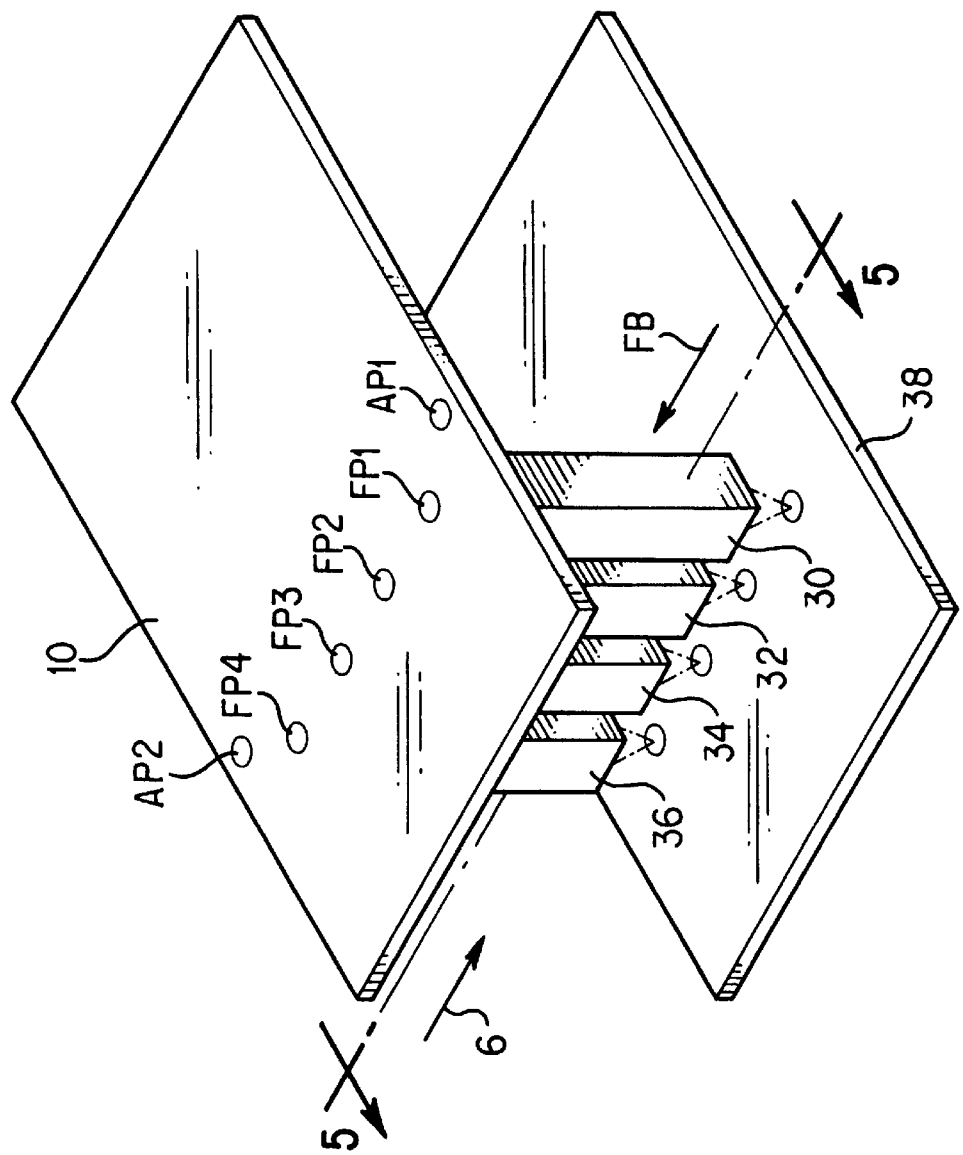
FIG. 2 is a perspective view showing only the focus sensor section of the exposure system in FIG. 1.
Figure 3:
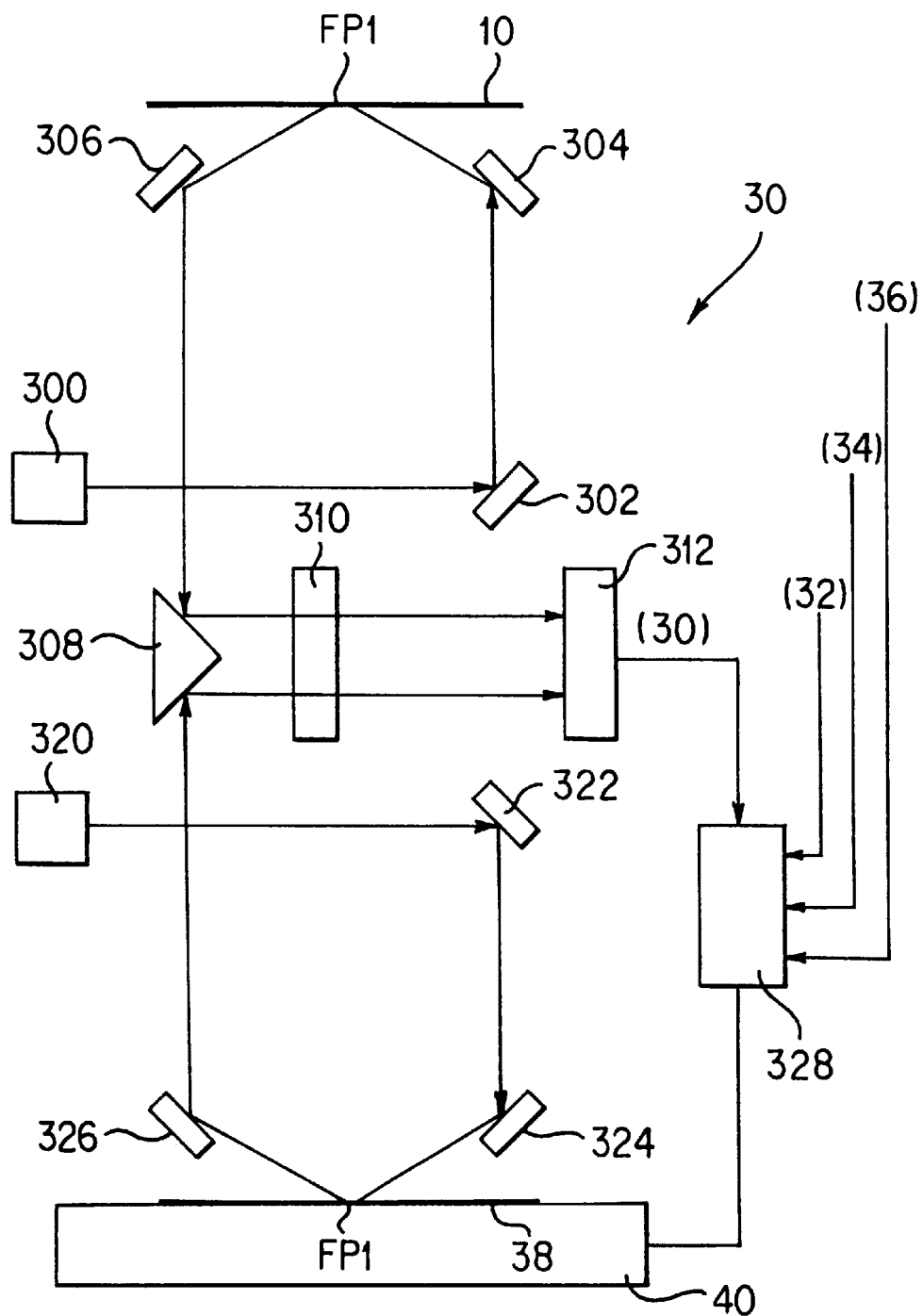
FIG. 3 is a schematic illustration showing a focus sensor.

The focus sensors 30 to 36 are further described below by referring to FIGS. 2 and 3. FIG. 2 shows only the portions of the focus sensors 30 to 36 in FIG. 1. FIG. 3 shows the focus sensor 30 viewed from the arrow FB in FIG. 2. First, the mask side is described. The detection light emitted from a light source 300 such as, e.g., an LED infrared light-emitting diode, is reflected by mirrors 302 and 304, enters the mask 10 (pattern forming plane), upon which it is focused in the form of a slit. It is assumed that the incident point of detection light on the pattern plane of the mask 10 is a focus point FP1. The light reflected on the focus point FP1 is reflected by mirrors 306 and 308, passes through a lens 310, and enters a detector 312 upon which the light is focused. The detector 312 uses an optical position sensor such as, e.g., a one-dimensional CCD image sensor or a MOS linear image sensor.

The plate side is also similarly constituted. That is, the detection light emitted from a light source 320 is reflected by mirrors 322 and 324 and is focused upon the focus point FP1 on the plate 38. The light reflected on the focus point FP1 is reflected by a mirror 326 and the mirror 308, passes through the lens 310, and enters the detector 312 upon which the light is focused.

Thus, the focus sensor 30 applies detection light to the focus point FP1 of the mask 10 and to the focus point FP1 of the plate 38, which are almost conjugate with a projection optical system and condenses the light reflected from the mask 10 and on the focus point FP1 by detection systems (mirror 308 and lens 310) to focus the light on the detector 312. In the case of the detector 312, when positions of the mask 10 or plate 38 in the Z direction change, two detection-light incident positions are changed. An output of the detector 312 is input to a main control system 328. The main control system 328 detects the relative positional relation in the Z direction between FP1 on the mask plane and FP1 on the plate plane.

The focus sensors 32, 34, and 36 are also similarly constructed so that the relative positional relation between mask plane and plate plane is detected by applying detection light to focus points FP2, FP3 and FP4, respectively.

The main control system 328 controls the Z leveling stage 42 of the plate stage 40 in accordance with the relative positional relation between the mask 10 and the plate 38 detected at each focus point. Thereby, the relative interval (space) between the mask 10 and the plate 38 and the relative inclination between the mask 10 and the plate 38 are adjusted.

Figure 4:
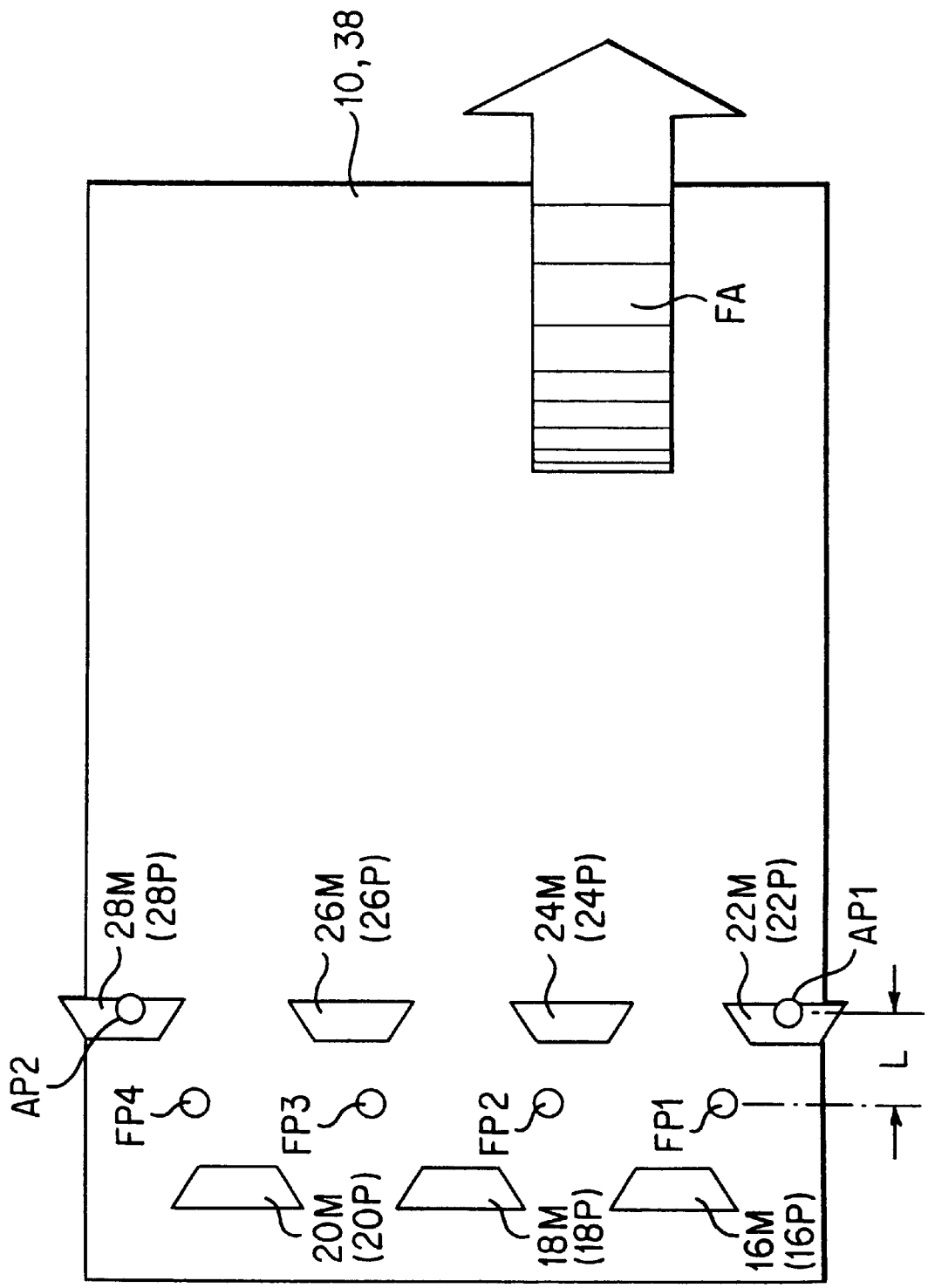
FIG. 4 is a plan view showing the relation between a visual field region, a projection region, a focus point, and an alignment point of a projection optical system.

FIG. 4 is a plan view of the regions 16M to 28M and projection regions 16P to 28P of the projection optical system 14 and the focus points FP1 to FP4 of the focus sensors 30 to 36, and alignment points (detection positions) AP1 to AP2 of the alignment sensors 44, 46. The illumination regions 16M to 20M or projection regions 16P to 20P by the front-group projection lens units 16 to 20 are arranged in the direction vertical (orthogonal) to a scanning direction. Then, the focus points FP1 to FP4 are similarly arranged in the direction vertical (orthogonal) to the scanning direction. Thereafter, the illumination regions 22M to 28M or projection regions 22P to 28P by the rear-group lens units 22 to 28 are arranged. The alignment points AP1 to AP2 are set to positions different from the focus points FP1 to FP4, that is, end positions of the mask and plate as shown in FIG. 4.

A focus control operation performed by the above exposure system is described in the case of exposure and in the case of alignment mark detection, respectively.

(1) Operation during exposure

Figure 5:
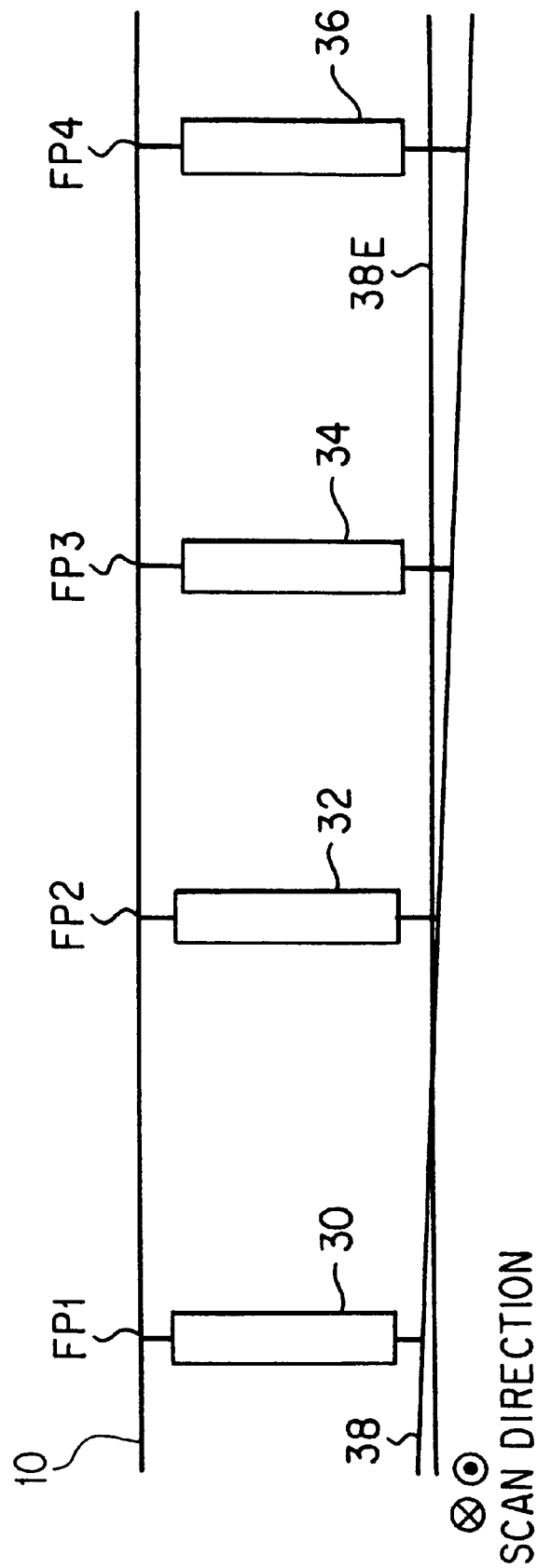
FIG. 5 is an illustration showing an auto-focus operation during (scanning) exposure in the direction perpendicular to a scanning direction.

First, an auto-focus operation used during exposure is described below. FIG. 5 shows the positional relation between the mask 10 and the plate 38 at a cross section viewed in the direction of the arrow along the line 5—5 in FIG. 2. The mask 10 and plate 38 may each have an undesirable flatness (i.e., it may be warped or wavy) or an inclination. However, because focus is a problem involving a relative distance between the mask and plate, in the following description, the mask-10 side is assumed to be flat for easy understanding.

In the case of the focus sensors 30 to 36, the relative positional relation between the mask plane and the plate plane at each of the focus points FP1 to FP4 is detected. During exposure, an approximate focus plane 38E where the mask 10 and the plate 38 have the most accurate focus (based on the known characteristics of the projection optical system 14) is calculated in accordance with the above detection results by using, for example, the least-squares method. By driving the Z leveling stage 42 of the plate stage 40 in accordance with the calculation result, the plate plane (i.e., the plane of the plate) is adjusted to the approximate focus plane 38E.

As another example, a case is considered in which the plate 38 (or mask 10) has warpage or waviness as shown in FIG. 6A. In the case of the focus sensors 30 to 36, the relative positional relation between the mask plane and the plate plane at each of the focus points FP1 to FP4 is similarly detected and the approximate focus plane 38E is calculated in accordance with the least-squares method. The plate plane is adjusted to the approximate focus plane 38E by driving the plate stage.

As described above, it is desirable to adjust a focus on the entire plate plane during exposure. Therefore, focus control is performed by directly using all the detection results of the focus points FP1 to FP4. Thereby, focus errors are generally dispersed, which is preferable.

(2) Operation during alignment mark detection

An auto-focus operation during alignment mark detection is described below. Alignment marks on the plate 38 are detected by the alignment sensors 44 and 46 shown in FIG. 1 through the rear-group lens units 22 and 28 of the projection optical system 14. Therefore, the alignment points AP1 and AP2, which are located near a circumference of the plate 38, as shown in FIG. 4 or FIG. 6A are used. Therefore, if the focus operation is performed similarly to the case during exposure, the alignment points AP1 and AP2 are deviated from the approximate focus plane 38E as shown in FIG. 6A. It is desirable to have the alignment points be as close as possible to the approximate focus plane.

Therefore, in the case of this embodiment, an approximate focus plane 38A is obtained by using only the detection results output by the focus sensors 30 and 36, which are located at both of the ends of the line of sensors 30–36 (i.e., using sensors located near the plate circumference, which are closest to the alignment points) without using the detection results of the two central focus sensors 32 and 34. That is, as shown in FIG. 6B, the auto-focus operation is performed by using the detection results at the focus points FP1 and FP4 closest to the alignment points AP1 and AP2 without using the detection results at the central focus points FP2 and FP3. As a result, the plate 38 is driven so as to be adjusted to the approximate focus plane 38A during alignment mark detection. As can be understood by comparing FIGS. 6A and 6B, because this embodiment realizes a high-accuracy focus control, it is possible to more accurately detect the position of an alignment mark.

(3) Second operation example during alignment mark detection

Figure 7:
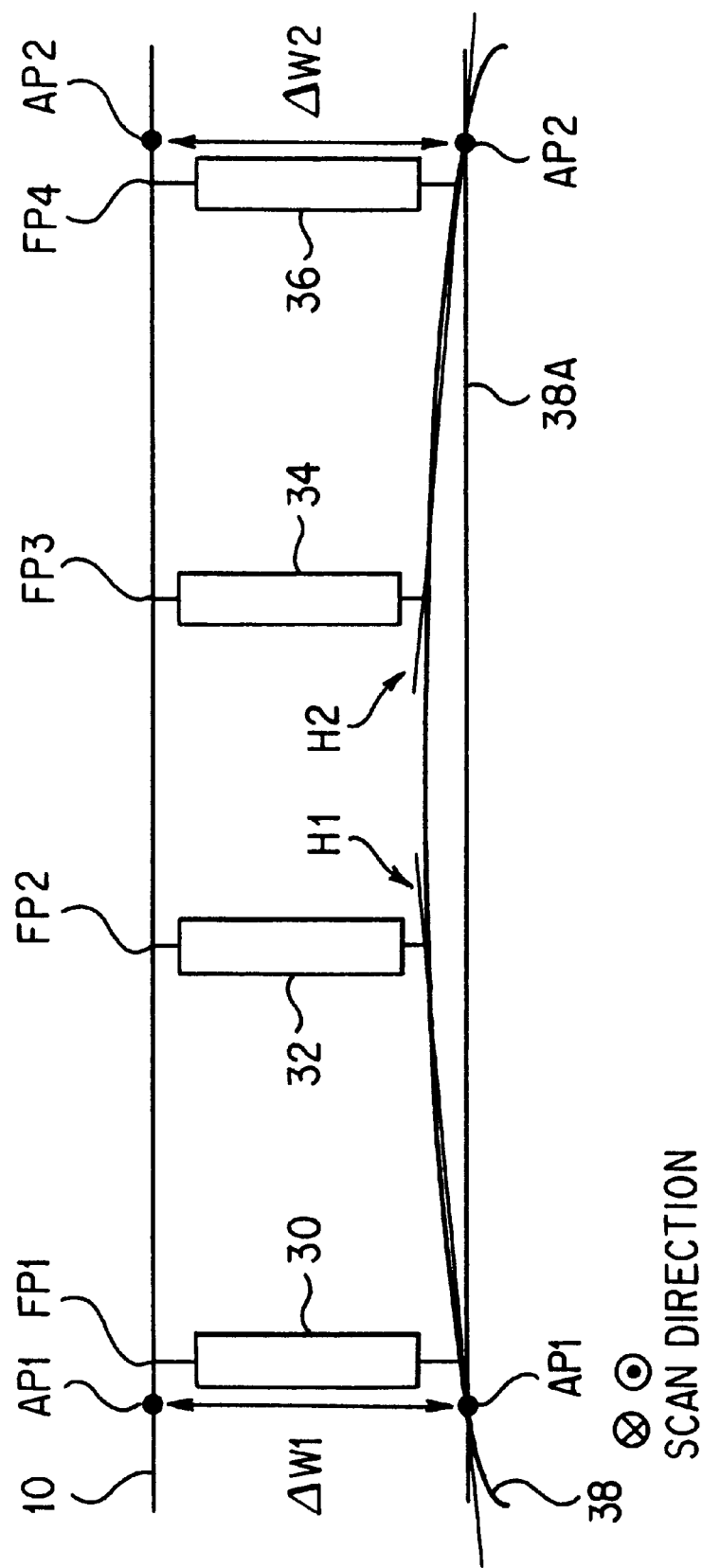
FIG. 7 is an illustration showing another auto-focus operation during alignment when there is warpage or waviness in the direction perpendicular to a scanning direction.

Another auto-focus operation during alignment mark detection is described below by referring to FIG. 7. In this case, detection results output by all focus sensors 30 to 36 are used. However, differently from the case in which exposure is performed, the detection results are computed by dividing them into right and left sensors. That is, a virtual plane H1 between two measurement points is obtained by using measurement results of the focus sensors 30 and 32 at the focus points FP1 and FP2 and a mask plate interval W1 at the nearby alignment point AP1 is estimated using the virtual plane H1.

Similarly, a virtual plane H2 between two measurement points is obtained by using measurement results of the focus sensors 34 and 36 at the focus points FP3 and PF4 and a mask plate interval W2 at the nearby alignment point AP2 is estimated using the virtual plane H2. Then, the approximate focus plane 38A is obtained from the mask plate intervals W1 and W2 at the alignment points AP1 and AP2, obtained as described above, and the plate 38 is driven so as to be adjusted to the plane 38A and an auto-focus operation is performed.

Also in the case of this example, the relative interval and inclination between a mask and a plate are adjusted by using only the information on a focus point close to an alignment point (mark detection position) during alignment mark detection. Therefore, the position of an alignment mark can be more accurately detected.

(4) Third operation example during alignment mark detection

Still another example of an auto-focus operation during alignment mark detection is described below by referring to FIGS. 8A and 8B. The above-described embodiment detects a positional deviation between an alignment point and a focus point in the direction vertical (orthogonal) to a scanning direction. However, this example detects a positional deviation between an alignment point and a focus point in the scanning direction.

Under a normal scanning exposure operation, focus servo is always performed because it is necessary to equally adjust a focus to the front-group lens units 16 to 20 and the rear-group lens units 22 to 28. In other words, the focus points FP1 to FP4 are always located near the above-described approximate focus plane 38E. However, there is a positional deviation of a distance L between the focus points FP 1 to FP4 on one hand and the alignment points AP1 and AP2 on the other as shown in FIG. 4 and FIG. 8B. Therefore, as shown in FIG. 8A, if the plate 38 (or mask 10) has warpage or waviness, a focus error "d" is produced when viewed from the alignment points AP1 and AP2.

Therefore, during alignment mark detection, when alignment marks to be detected on the mask 10 and plate 38 are moved to alignment points of alignment sensors and the focus points FP1 to FP4 fall in line with the alignment marks to be detected in a scanning direction (FA direction) (that is, when the alignment marks to be detected on the mask 10 and plate 38 arrive at positions by the distance L on one side of the alignment points AP1 and AP2), the focus servo is stopped.

That is, the relative interval and inclination between the mask 10 and the plate 38 are adjusted in accordance with the positional information detected at each of focus points FP1 to FP4 when the focus points FP1 to FP4 fall in line with the alignment marks to be detected in the scanning direction (FA direction), the servo control in Z direction is stopped at that time (or is held in this state), and the alignment marks to be detected under the above state are moved to alignment points of the alignment sensors 44 and 46 to detect the alignment marks using the alignment sensors 44 and 46. Therefore, it is possible to detect the alignment marks by the alignment sensors 44 and 46 while the focus error "d" shown in FIG. 8A is eliminated and more accurately measure the positions of the alignment marks of the mask and plate.

The present invention includes many embodiments and they can be modified in accordance with the above disclosure. For example, the following modifications are included.

Though the above embodiment uses three front-group lens units and four rear-group lens units, it is possible to change the number of lens units according to necessity. The present invention is not restricted to the case of dividing and projecting a mask pattern by using a plurality of lens units. That is, a single lens unit can be included. It is possible to use an optional number of focus sensors. Moreover, it is possible to design the structure of each component such as a focus sensor or alignment sensor according to necessity.

The above embodiment performs an auto-focus operation for an approximate focus plane by driving the substrate (plate) side. However, it is possible to perform the auto-focus operation by driving the mask side or both sides. Moreover, among the above operation examples (1) to (4) at detection of an alignment mark, it is possible to use the operation examples (2) and (4) or (3) and (4) together.

In the above-described embodiment, use is made of a projection optical system that projects erect positive images at one-to-one magnification. However, the present invention can also be applied in a case where use is made of a projection optical system which projects inverted images at one-to-one magnification. However, in a case where inverted images are projected, the scanning directions of the mask and plate become opposite and therefore, it is necessary to provide a stage for the mask and a stage for the plate that move discretely from each other. Also, since the scanning directions are opposite, in order to pre-read the information of the interval, the focus detecting system on the mask side and the focus detecting system on the plate side should be provided in opposite directions. The present invention can also be applied to a case where the pattern of the mask is reduced or enlarged and transferred onto the plate.

As described above, in the case of the present invention, adjustment is performed by using the measurement result output by each of a plurality of focus sensors during scanning exposure and adjustment is performed by using the result of focus sensors located near an alignment point among the measurement results by the focus sensors during alignment. Therefore, an advantage can be obtained that it is possible to improve the alignment accuracy by improving the focus accuracy during alignment even if a substrate or mask has warpage or waviness.

While this invention has been described in conjunction with specific embodiments thereof, it is evident that many alternatives, modifications and variations will be apparent to those skilled in the art. Accordingly, the preferred embodiments of the invention set forth herein are intended to be illustrative, not limiting. Various changes may be made without departing from the spirit and scope of the invention as defined in the following claims.

What is claimed is:

1. A method of controlling focus in a scanning-type exposure apparatus that projects an image of a pattern formed on a mask onto a substrate through a projection optical system while synchronously moving the mask and the substrate relative to the projection optical system, the scanning-type exposure apparatus including: a focus detection system having a plurality of measurement points in a predetermined plane that approximates an imaging plane of the pattern image onto the substrate by the projection optical system to detect positional information of the substrate in an optical axis direction of the projection optical system at each of the measurement points; and an alignment sensor having a detection point at a position different from the measurement points in the predetermined plane to detect an alignment mark formed on the substrate; the method comprising the steps of:

adjusting at least one of an interval between the mask and the substrate and a relative inclination between the mask and the substrate using detection results at all of the measurement points of the focus detection system during scanning exposure; and adjusting at least one of the interval between the mask and the substrate and the relative inclination between the mask and the substrate using the detection result at less than all of the measurement points during alignment.

2. The method of claim 1, wherein:

the measurement points of the focus detection system extend in a direction orthogonal to a scanning direction in which the mask and substrate are moved during scanning exposure; and the detection point of the alignment sensor is set to a position different from the measurement points in a direction orthogonal to the scanning direction.

3. The method of claim 1, wherein the measurement points used during alignment are located closer to the detection point of the alignment sensor than the measurement points that are not used during alignment.

4. The method of claim 1, wherein the focus detection system also includes measurement points that detect positional information of the mask at positions conjugate with the measurement points of the substrate relative to the projection optical system.

5. A method of controlling focus in a scanning-type exposure apparatus that projects an image of a pattern formed on a mask onto a substrate through a projection optical system while synchronously moving the mask and the substrate relative to the projection optical system, the scanning-type exposure apparatus including: a focus detection system having a plurality of measurement points in a predetermined plane that approximates an imaging plane of the pattern image onto the substrate by the projection optical system to detect positional information of the substrate in an optical axis direction of the projection optical system at each of the measurement points; and an alignment sensor having a detection point at a position different from the measurement points in the predetermined plane to detect an alignment mark formed on the substrate; the method comprising the steps of:

adjusting at least one of an interval between the mask and the substrate and a relative inclination between the mask and the substrate using detection results at all of the measurement points of the focus detection system during scanning exposure; and adjusting at least one of the interval between the mask and the substrate and the relative inclination between the mask and the substrate by estimating a deviation from the predetermined plane on the surface of the substrate at the detection point of the alignment sensor in accordance with the detection results at the measurement points of the focus detection system during alignment.

6. The method of claim 5, wherein:

the measurement points of the focus detection system extend along a direction orthogonal to a scanning direction in which the mask and the substrate are moved during scanning exposure; and the detection point of the alignment sensor is set adjacent to the measurement points in the direction orthogonal to the scanning direction.

7. The method of claim 5, wherein the focus detection system also includes measurement points that detect positional information of the mask at positions conjugate with the measurement points of the substrate relative to the projection optical system.

8. A method of controlling focus in a scanning-type exposure apparatus that projects an image of a pattern formed on a mask onto a substrate through a projection optical system while synchronously moving the mask and the substrate relative to the projection optical system, the scanning-type exposure apparatus including: a focus detection system having a plurality of measurement points in a predetermined plane that approximates an imaging plane of the pattern image onto the substrate by the projection optical system to detect positional information of the substrate in an optical axis direction of the projection optical system at each of the measurement points; and an alignment sensor having a detection point at a position different from the measurement points in the predetermined plane to detect an alignment mark formed on the substrate; the method comprising the steps of:

adjusting at least one of an interval between the mask and the substrate and a relative inclination between the mask and the substrate using detection results at all of the measurement points of the focus detection system during scanning exposure; and adjusting at least one of the interval between the mask and the substrate and the relative inclination between the mask and the substrate using the detection results at the measurement points of the focus detection system when the alignment mark on the substrate is located by a predetermined distance to one side of the detection point of the alignment sensor in the scanning direction.

9. The method of claim 8, wherein the focus detection system also includes measurement points that detect positional information of the mask at positions conjugate with the measurement points of the substrate relative to the projection optical system.

10. A method of controlling focus in a scanning-type exposure apparatus that projects an image of a pattern formed on a mask onto a substrate through a projection optical system while synchronously moving the mask and the substrate relative to the projection optical system, the scanning-type exposure apparatus including: a focus detection system having a plurality of measurement points in a predetermined plane that approximates an imaging plane of the pattern image onto the substrate by the projection optical system to detect positional information of the substrate in an optical axis direction of the projection optical system at each of the measurement points; and an alignment sensor having a detection point at a position different from the measurement points in the predetermined plane to detect an alignment mark formed on the substrate; the method comprising the steps of:

adjusting at least one of an interval between the mask and the substrate and a relative inclination between the mask and the substrate during scanning exposure according to a first focusing operation that uses the focus detection system; and adjusting at least one of the interval between the mask and the substrate and the relative inclination between the mask and the substrate during alignment according to a second focusing operation that is different from the first focusing operation and that also uses the focus detection system.

11. The method of claim 10, wherein:

the measurement points of the focus detection system extend along a direction orthogonal to a scanning direction in which the mask and the substrate are moved during scanning exposure; and the detection point of the alignment sensor is set adjacent to the measurement points in the direction orthogonal to the scanning direction.

12. The method of claim 10, wherein the focus detection system also includes measurement points that detect positional information of the mask at positions conjugate with the measurement points of the substrate relative to the projection optical system.

13. A scanning-type exposure apparatus that projects an image of a pattern formed on a mask onto a substrate through a projection optical system while synchronously moving the mask and the substrate relative to the projection optical system, the scanning-type exposure apparatus comprising:

a focus detection system having a plurality of measurement points in a predetermined plane that approximates an imaging plane of the pattern image onto the substrate by the projection optical system to detect positional information of the substrate in an optical axis direction of the projection optical system at each of the measurement points;

an alignment sensor having a detection point at a position different from the measurement points in the predetermined plane to detect an alignment mark formed on the substrate; and a focus controller that adjusts at least one of an interval between the mask and the substrate and a relative inclination between the mask and the substrate during scanning exposure according to a first focusing operation that uses the focus detection system and that adjusts at least one of the interval between the mask and the substrate and the relative inclination between the mask and the substrate during alignment according to a second focusing operation that is different from the first focusing operation and that also uses the focus detection system.

14. The apparatus of claim 13, wherein, in the first focusing operation, the focus controller uses detection results at all of the measurement points of the focus detection system.

15. The apparatus of claim 14, wherein, in the second focusing operation, the focus controller uses the detection result at less than all of the measurement points during alignment.

16. The apparatus of claim 15, wherein the measurement points used in the second focusing operation are located closer to the detection point of the alignment sensor than the measurement points that are not used during the second focusing operation.

17. The apparatus of claim 14, wherein, in the second focusing operation, the focus controller estimates a deviation from the predetermined plane on the surface of the substrate at the detection point of the alignment sensor in accordance with the detection results at the measurement points of the focus detection system.

18. The apparatus of claim 14, wherein, in the second focusing operation, the focus controller uses the detection results at the measurement points of the focus detection system when the alignment mark on the substrate is located by a predetermined distance to one side of the detection point of the alignment sensor in the scanning direction.

19. The apparatus of claim 13, wherein, in the second focusing operation, the focus controller uses the detection result at less than all of the measurement points during alignment.

20. The apparatus of claim 19, wherein the measurement points used in the second focusing operation are located closer to the detection point of the alignment sensor than the measurement points that are not used during the second focusing operation.

21. The apparatus of claim 13, wherein, in the second focusing operation, the focus controller estimates a deviation from the predetermined plane on the surface of the substrate at the detection point of the alignment sensor in accordance with the detection results at the measurement points of the focus detection system.

22. The apparatus of claim 13, wherein, in the second focusing operation, the focus controller uses the detection results at the measurement points of the focus detection system when the alignment mark on the substrate is located by a predetermined distance to one side of the detection point of the alignment sensor in the scanning direction.

23. The apparatus of claim 13, wherein:

the measurement points of the focus detection system extend along a direction orthogonal to a scanning direction in which the mask and the substrate are moved during scanning exposure; and the detection point of the alignment sensor is set adjacent to the measurement points in the direction orthogonal to the scanning direction.

24. The apparatus of claim 13, wherein the focus detection system also includes measurement points that detect positional information of the mask at positions conjugate with the measurement points of the substrate relative to the projection optical system.

* * * * *